United States Patent
Tagami et al.

[11] Patent Number: 5,402,031
[45] Date of Patent: Mar. 28, 1995

[54] PIEZOELECTRIC TRANSFORMER HAVING IMPROVED ELECTRODE ARRANGEMENT

[75] Inventors: Satoru Tagami; Jun Kawai; Akira Fukuoka, all of Tokyo, Japan

[73] Assignee: NEC Corporation, Tokyo, Japan

[21] Appl. No.: 177,070

[22] Filed: Jan. 3, 1994

[30] Foreign Application Priority Data

Dec. 31, 1992 [JP] Japan .................... 4-360169

[51] Int. Cl.6 .................................. H01L 41/08
[52] U.S. Cl. ............................. 310/359; 310/366
[58] Field of Search ............ 310/358, 359, 366, 319

[56] References Cited

U.S. PATENT DOCUMENTS

| | | | |
|---|---|---|---|
| 2,974,296 | 3/1961 | Rosen | 310/359 |
| 3,487,239 | 12/1969 | Schafft | 310/359 |
| 3,736,446 | 5/1973 | Berlincourt et al. | 310/359 X |
| 3,764,848 | 10/1973 | Berlincourt | 310/359 X |
| 5,118,982 | 6/1992 | Inoue | 310/366 |

FOREIGN PATENT DOCUMENTS

| | | | |
|---|---|---|---|
| 0079778 | 5/1983 | Japan | 310/359 |
| 63-272084 | 11/1988 | Japan | 310/359 |
| 440734 | 1/1975 | U.S.S.R. | 310/359 |
| 285705 | 12/1976 | U.S.S.R. | 310/359 |
| 336702 | 12/1977 | U.S.S.R. | 310/359 |

*Primary Examiner*—Mark O. Budd
*Attorney, Agent, or Firm*—Sughrue, Mion, Zinn, Macpeak & Seas

[57] ABSTRACT

A long relatively thin rectangular body of piezoelectric material is divided into driving and driven regions in a longitudinal direction thereof. Two electrodes are applied respectively to two major surfaces of the driving region which is polarized in a thickness direction of the driving region. Another two electrodes are formed on one major surface of the driven region. Each of the two electrodes applied to the driven region has a plurality of finger-like portions which extend in the longitudinal direction. The finger-like portions of formed on the driven region are arranged in an interdigital manner. The driven region has a plurality of regions which are defined by adjacent finger-like portions and which are polarized in a direction perpendicular to the longitudinal direction.

22 Claims, 7 Drawing Sheets

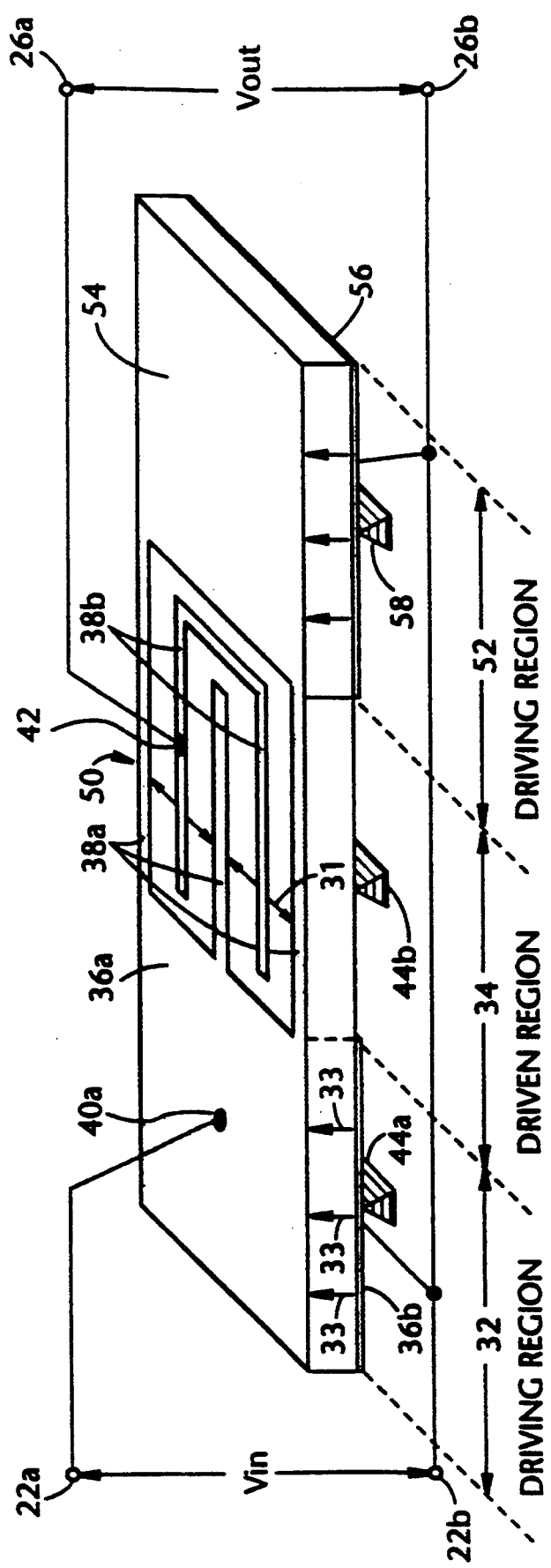

PIEZOELECTRIC TRANSFORMER HAVING IMPROVED ELECTRODE ARRANGEMENT

BACKGROUND OF THE INVENTION

1. Field of the Invention

The present invention relates generally to a piezoelectric transformer, and more specifically to a voltage step-up type piezoelectric transformer which features an improved electrode arrangement which reduces the size of the transformer and ensures highly reliable operation thereof.

2. Description of Related Art

In most of cases, an electromagnetic type transformer is used for generating a high output voltage, of the nature used in photocopiers, backlights of LCD (Liquid Crystal Displays) or the like.

On the other hand, a piezoelectric transformer which operates on a principle which is totally different from that of a conventional electromagnetic transformer, has been proposed.

Throughout the instant disclosure, like portions or elements of the drawings are denoted by like reference numerals.

Before turning to the present invention it is deemed preferable to describe a conventional voltage step-up type piezoelectric transformer with reference to FIG. 1.

The piezoelectric transformer as shown in FIG. 1 is disclosed in U.S. Pat. No. 2,974,296 granted to C. A. Rosen.

As shown in FIG. 1, a long relatively thin rectangular body 10 of piezoelectric material is divided into two regions 12 and 14 each of which extends in a longitudinal direction of the body 10 a distance equal to one half of the length thereof. The region 12 is referred to as a driving region while the region 14 is referred to as a driven region (or power generating region).

A pair of electrodes 16a and 16b is applied to upper and lower surfaces of the driving region 12. On the other hand, the driven region 14 has an electrode 18 applied to the end of the body 10 remote from the region 12. The driving region 12 is polarized in the thickness direction of the body 10 as indicated by arrows 13 while the driven region 14 is polarized in the longitudinal direction of the body 10 as indicated by arrows 15.

A connection wire 20a has one end thereof fixedly coupled to a junction 21 provided at the center of the electrode 16a. Similarly, a connection wire 20b has one end thereof fixedly coupled to a junction (not shown) provided at the center of the electrode 16b. On the other hand, a connection wire 24a is provided between a junction 25 and an output terminal 26a. Further, a connection wire 24b has one end thereof coupled to an output terminal 26b and the other end thereof coupled to the wire 20b.

If an input voltage Vin applied to the pair of input terminals 22a and 22b has a frequency equal to that of the longitudinal resonance vibration of the body 10, the body 10 is caused to resonantly vibrate. Thus, a high AC (alternating current) voltage Vout is obtained between the output terminals 26a and 26b. The frequency of the output voltage Vout is identical to that of the input voltage Vin.

The above-mentioned piezoelectric transformer, however, has encountered the following drawbacks.

In the case where the piezoelectric transformer shown in FIG. 1 is utilized as a voltage step-up transformer, a voltage transformation ratio (denoted by Rv) under ideal conditions is given by $$Rv \propto L/2d \cdot K \quad (1)$$

where L is the length of the body 10 in the longitudinal direction thereof;

d is the thickness of the body 10; and

K is a constant (usually less than unity) depending on compliance and electro-mechanical coupling coefficients of the material of the body 10 when taking anisotropy into account.

Expression (1) indicates that the transformation ratio Rv is proportional to L/2d.

The body 10 is typically manufactured as follows. Initially, a piezoelectric ceramic block is cut into a piece having a suitable size and then ground to the required thickness. However, it is practically difficult to reduce the thickness of the body 10 to an extent ranging less 0.2 mm or 0.3 mm. Accordingly, if the voltage transformation ratio Rv of about 100 is required, the length L of the body 10 should be more than 30 mm. Thus, the length of the driven region 14 is 15 mm (viz., 30 mm/2).

This means that the driven region 14 should be polarized in the longitudinal direction thereof over the full length thereof (viz., 15 mm). In such a case, DC (direct current) voltage as high as 50–60 KV is required for the polarization at a room temperature. Thus, the above-mentioned prior art has encountered the drawback that an expensive high voltage power source is undesirably required. Further, such a high DC voltage is liable to induce dielectric breakdown between the polarizing electrodes during polarization, and hence it is in practice extremely difficult to polarize such a lengthy region.

One approach to overcoming the above-mentioned problems is to polarize the body 10 while maintaining the temperature thereof over a Curie temperature (about 300° C.). In this instance, a voltage of about 5–6 KV is still required for polarizing the driven region 14 whose longitudinal length is about 15 mm. Additionally, another problem has been encountered in this case in that it is very difficult to electrically isolate the electrodes 16a–16b and 18 at high temperatures such these in excess of 300° C.

Accordingly, with the arrangement of FIG. 1, it is practically impossible to achieve a sufficiently high voltage transformation ratio.

On the other hand, it is known that the transformation ratio can be elevated with increase in the lateral cross section of the body 10. That is, if the width of the body is increased, the transformation ratio can be raised. However, as the width increases relative to the longitudinal length of the body, spurious vibrations (viz., vibrations in the transverse direction of the body) become noticeable to the degree that longitudinal vibrations (d) of the body 10 become undesirably weakened. Thus, the width of the body should be less than about one-fourth (¼) of the longitudinal length (L).

From the foregoing, it will be understood that the arrangement shown in FIG. 1 is not expected to achieve a high voltage step-up transformation ratio.

SUMMARY OF THE INVENTION

It is therefore an object of the present invention to provide a piezoelectric transformer which features an improved electrode arrangement of a driven region by which a high transformation ratio can be attained without increasing the size of the transformer.

In brief, the above object is achieved by a long relatively thin rectangular body of piezoelectric material is divided into driving and driven regions in a longitudinal direction thereof. Two electrodes are applied respectively to two major surfaces of the driving region which is polarized in a thickness direction of the driving region. Another two electrodes are formed on one major surface of the driven region. Each of the two electrodes applied to the driven region has a plurality of finger-like portions which extend in the longitudinal direction. The finger-like portions of formed on the driven region are arranged in an interdigital manner. The driven region has a plurality of regions which are defined by adjacent finger-like portions and which are polarized in a direction perpendicular to the longitudinal direction.

A first aspect of the present invention resides in a piezoelectric transformer comprises a long relatively thin rectangular body of piezoelectric material. The body exhibits a resonant mode of vibration at a predetermined frequency in a longitudinal direction of the body. The body is divided into first and second regions in the longitudinal direction. First and second electrodes are applied respectively to first and second major surfaces of the first region. The first region is polarized in a thickness direction of the first region. Third and fourth electrodes are formed on the first major surface of the second region. Each of the third and fourth electrodes has a plurality of finger-like portions extending in the longitudinal direction. Each of the plurality of finger-like portions of the third electrode has one end electrically coupled to the first electrode. The fourth electrode has a bar portion which extends transversely of the body and from which the plurality of finger-like portions of the fourth electrode extend. The plural finger-like portions of the third and fourth electrode are arranged interdigitally. The second region has a plurality of regions which are defined by adjacent finger-like portions of the third and fourth electrodes and which are polarized in a direction perpendicular to the longitudinal direction.

A second aspect of the present invention resides in a piezoelectric transformer which comprises a long relatively thin rectangular body of piezoelectric material. The body has first and second major surfaces and exhibits a resonant mode of vibration at a predetermined frequency in a longitudinal direction of the body. The body is divided into first and second regions in the longitudinal direction. First and second electrodes are applied respectively to the first and second major surfaces of the first region. The first region is polarized in a thickness direction of the first region. Third and fourth electrodes are formed on the first major surface of the second region. Each of the third and fourth electrodes has a plurality of finger-like portions extending in the longitudinal direction. The third electrode has an elongated portion which extends transversely of the body and from which the plurality of finger-like portions of the third electrode extend. The fourth electrode has an elongated portion which extends transversely of the body and from which the plurality of finger-like portions of the fourth electrode extend. The third and fourth electrode are arranged interdigitally. The second region has a plurality of regions which are defined by adjacent finger-like portions of the third and fourth electrodes and which are polarized in a direction perpendicular to the longitudinal direction.

A third aspect of the present invention resides in a piezoelectric transformer which comprises a long relatively thin rectangular body of piezoelectric material. The body has first and second major surfaces and exhibits a resonant mode of vibration at a predetermined frequency in a longitudinal direction of the body. The body is divided into first, second and third regions in the longitudinal direction. First and second electrodes are applied respectively to the first and second major surfaces of the first region. The first region is polarized in a thickness direction of the first region. Third and fourth electrodes are applied respectively to the first and second major surfaces of the third region. The second region is polarized in a thickness direction of the third region. Fifth and sixth electrodes are formed on the first major surface of the second region. Each of the fifth and sixth electrodes has a plurality of finger-like portions extending in the longitudinal direction. The fifth electrode is electrically coupled to the first and third electrodes. The sixth electrode has an elongated portion which extends transversely of the body and from which the plurality of finger-like portions of the sixth electrode extend. The plural finger-like portions of the third and fourth electrode are arranged interdigitally. The second region has a plurality of regions which are defined by adjacent finger-like portions of the fifth and sixth electrodes and which are polarized in a direction perpendicular to the longitudinal direction.

BRIEF DESCRIPTION OF THE DRAWINGS

The features and advantages of the present invention will become more clearly appreciated from the following description taken in conjunction with the accompanying drawings in which:

FIG. 7 is a schematic perspective view showing a third embodiment of the present invention.

DETAILED DESCRIPTION OF THE PREFERRED EMBODIMENTS

Before discussing the preferred embodiments of the present invention, the common points or conditions applicable to all the embodiments are described below.

(1) A sintered material which is commercially available from Tokin K. K. (Japanese company) under the trademark "NEPEC 8" is used. This material has a small electro-mechanical coupling coefficient $K_{31}$ (in a direction perpendicular to a polarization direction) and a large electro-mechanical coupling coefficient $K_{33}$ (in a polarization direction). A block of the above-mentioned sintered material was cut into a piece with desired dimensions for producing bodies of the preferred embodiments.

(2) Electrodes are formed on the body by patterning a silver-palladium paste containing 75% of silver and 25% of palladium by way of usual thick film screen techniques. Following this, the patterned electrodes are subjected to sintering at a temperature of 600° C.

(3) The body to which the electrodes have been applied, is immersed in an insulating oil pre-heated up to a temperature of 150° C. Subsequently, DC electric field strength of 1.5 KV/mm is applied to the body immersed for 15 minutes in order to polarize same.

Figure 2:
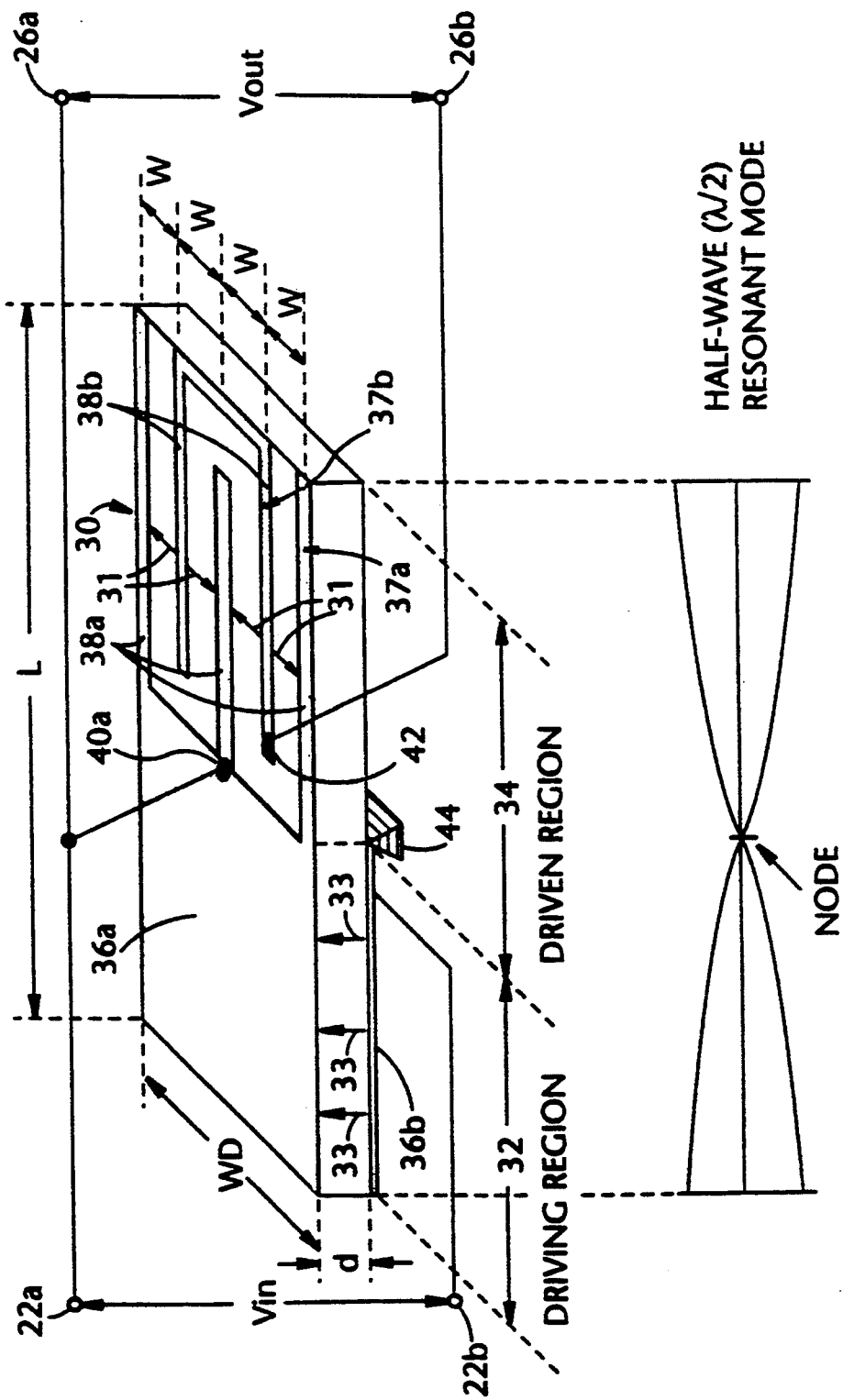
FIG. 2 is a schematic perspective view showing a first embodiment of the present invention together with a sketch showing vibration waves.

FIG. 2 illustrates a first embodiment of the present invention in perspective and a sketch showing resonant vibration waves for a better understanding of the embodiment.

As shown, a long relatively thin rectangular body 30 of piezoelectric material is divided into two regions 32 and 34 in the longitudinal direction of the body 30. In the first embodiment, each of these regions 32 and 34 extends longitudinally a distance equal to one half of the length of the body 30. The region 32 is referred to as a driving region while the region 34 is referred to as a driven region.

Figure 1:
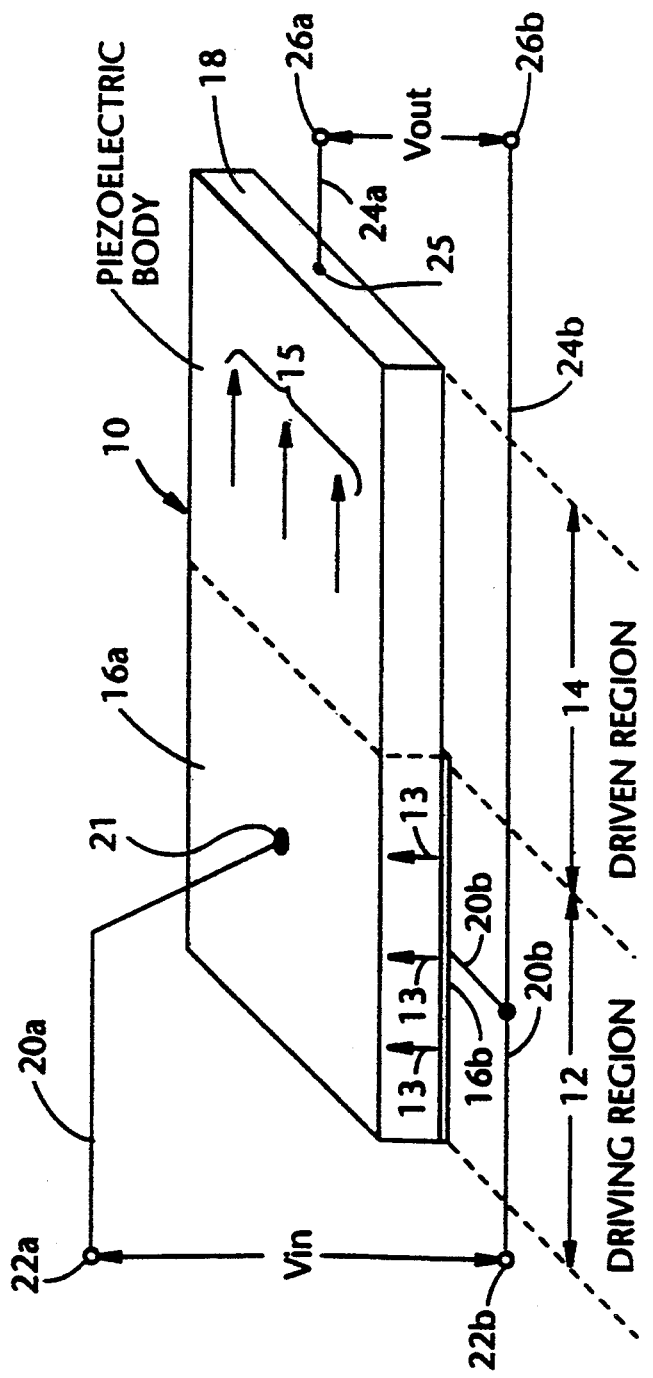
FIG. 1 is a schematic perspective view showing a conventional piezoelectric transformer referred to in the opening paragraphs of the instant disclosure.

The driving region 32 carries a pair of electrodes 36a and 36b which are respectively applied to the upper and lower surfaces thereof. The driving region 32 is polarized in a thickness direction of the body 30 as indicated by arrows 33. It is understood that the driving region 32 is essentially identical to the counterpart 12 of FIG. 1.

The driven region 34 has two electrodes 37a and 37b both of which are applied to the upper surface of the region 34. The electrode 37a includes three finger-like (viz., elongated narrow width) portions 38a. Similarly, the electrode 37b includes two finger-like portions 38b. The finger-like portions 38a and 38b extend in the longitudinal direction of the body 30 and arranged in an interdigital manner. The number of the finger-like portions is not limited to that shown in FIG. 1.

The driven region 34 is provided with a plurality of polarized areas which extend between the adjacent finger-like portions and which are transversely polarized in a direction perpendicular to the longitudinal direction as shown by arrows 31.

Each of the finger-like portions 38a of the electrode 37a has one end which is electrically coupled to the electrode 36a of the driving region 32. In contrast, the electrode 37b is electrically isolated. The electrode 37b includes a bar portion (no numeral) which extends transversely of the body 30 at the edge remote from the driving region 32. The bar portion is integral with one end of each of the finger-like portions 38b.

In order to apply an input AC voltage Vin to the driving region 32 for exciting same, two electrical junctions are formed on the electrodes 36a and 36b at opposite positions thereof. In FIG. 2, only one junction (denoted by 40a) is shown which is applied to the electrode 36a.

As shown in FIG. 2, an output voltage Vout is obtained between the junction 40a and a junction 42 attached to the electrode 38b.

The body 30 resonates as a half-wave resonator when the input AC voltage Vin has a predetermined resonance frequency. The longitudinal vibration nodes of the body 30 are on a transversal line which divides the two regions 32 and 34. Therefore, the junction 40a is free from the problem which results in undesirable separation or disconnection of the junctions from the electrode 36. On the other hand, the junction (no numeral) applied to the electrode 36b is not provided exactly on the node in that a support 44 of high elastic material is positioned on the node. However, the junction on the electrode 36b can be provided in the vicinity of the node, and hence there is no practical problem that the junction is undesirably separated from the electrode due to the body's vibration. Similar, the finger-like portion 38b extends to the vicinity of the node whereby the junction 42 on the electrode 37b is also practically free from the above-mentioned problem.

As shown, the support 44 of dielectric material is attached to the node of the body 30. Therefore, the support 44 is not affected by the longitudinal vibration of the body 30 nor does it influence the vibration of the body 30.

Given that the distance between the center lines of the adjacent finger-like portions is "W", a voltage transformation ratio Rv' of the transformer of FIG. 2 is given by:

$$Rv' \propto W/d \tag{2}$$

where d is the thickness of the body 30.
Further, the output electric power Pout is given by:

$$Pout \propto n \cdot W \cdot d \tag{3}$$

where n is the number of pairs of the adjacent finger-like portions.

When a piezoelectric transformer is designed (viz., when the dimensions of the transformer are determined), the width WD of the body 30 should be equal to or less than one-fourth of the length L of the body 30 in order to effectively suppress spurious vibrations. In other words, the following inequality should be satisfied.

$$L \geq 4n \cdot w \tag{4}$$

As seen from expressions (2), (3) and (4), if Rv' should be increased by increasing "W", the output electric power Pout inevitably decreases because "n" should be decreased in order to suppress the spurious vibration. This applies to the reverse case where Pout should be increased by increasing "n".

The inventors fabricated a piezoelectric transformer according to the first embodiment of FIG. 2 such that the dimensions and conditions were as follows:

L=78.6 mm; WD=20 mm; fd=1 mm (fd denotes the width of each of the finger-like portions); W=4.75; the resonant frequency at λ/2 resonant mode was 21 kHz; and a load of 100 KΩ was coupled to the transformer of FIG. 2.

According to experiments, when the transformer of FIG. 2 was excited by an input AC voltage of 24 Volts, the output voltage (viz., Vout) was 500 V. In this case, the output electric power obtained was 2.5 Watts.

Figure 3:
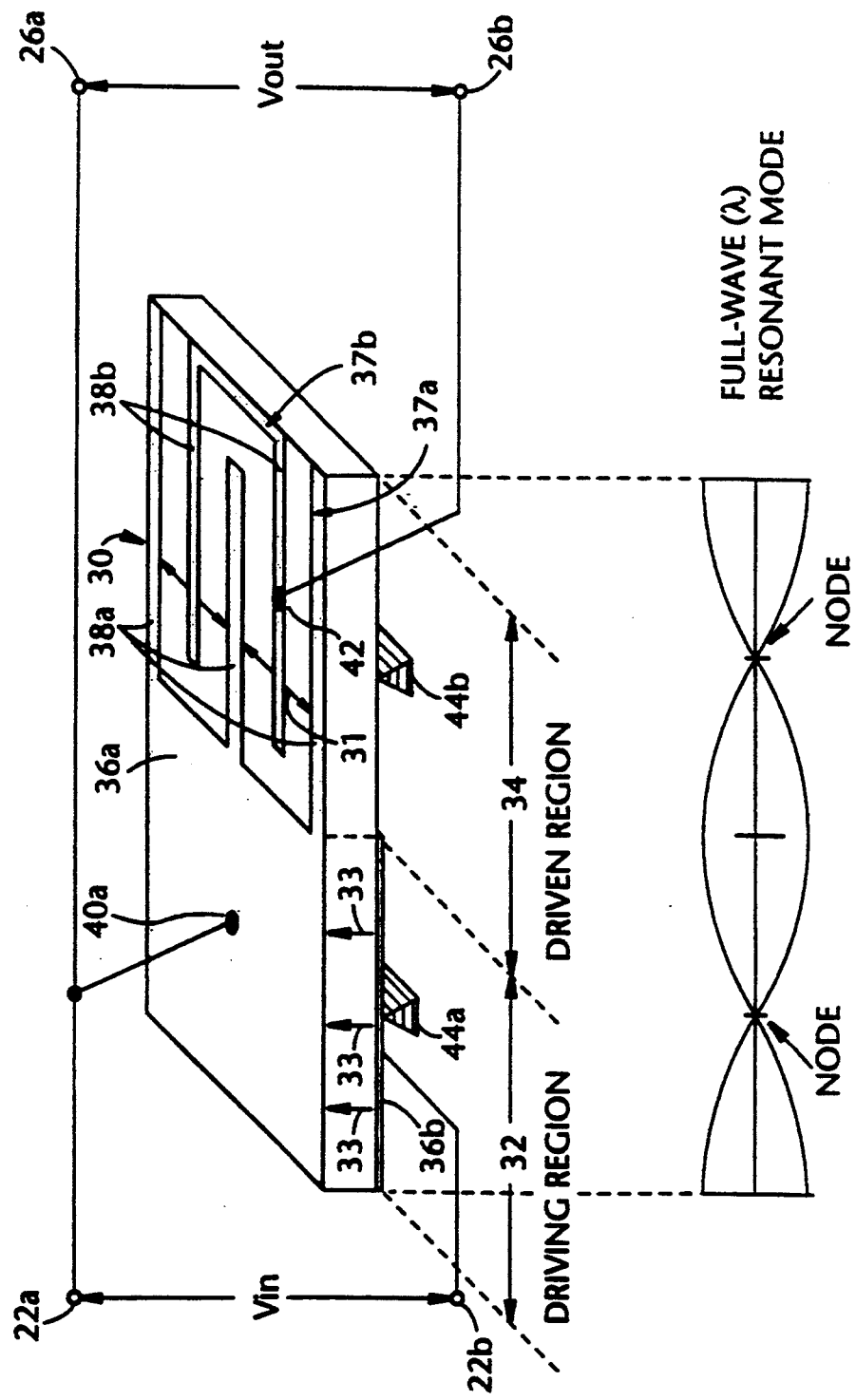
FIG. 3 is a schematic perspective view showing a first variant of the first embodiment of the present invention together with a sketch showing vibration waves.

FIG. 3 shows a variant of the first embodiment in perspective together with resonance waves for a better understanding of the operations thereof.

The piezoelectric transformer of FIG. 3 differs from that of FIG. 2 in that the former transformer operates at a full-wave (λ) resonant mode. Accordingly, two supports 44a and 44b of electrically non-conductive (viz., dielectric) material are respectively provided at two nodes. Further, electrical junctions 40a' and 42' are also provided at the nodes. Other than this, the arrangement of FIG. 3 is essentially the same as that of FIG. 2 and hence, further descriptions thereof will be omitted for brevity.

Figure 4:
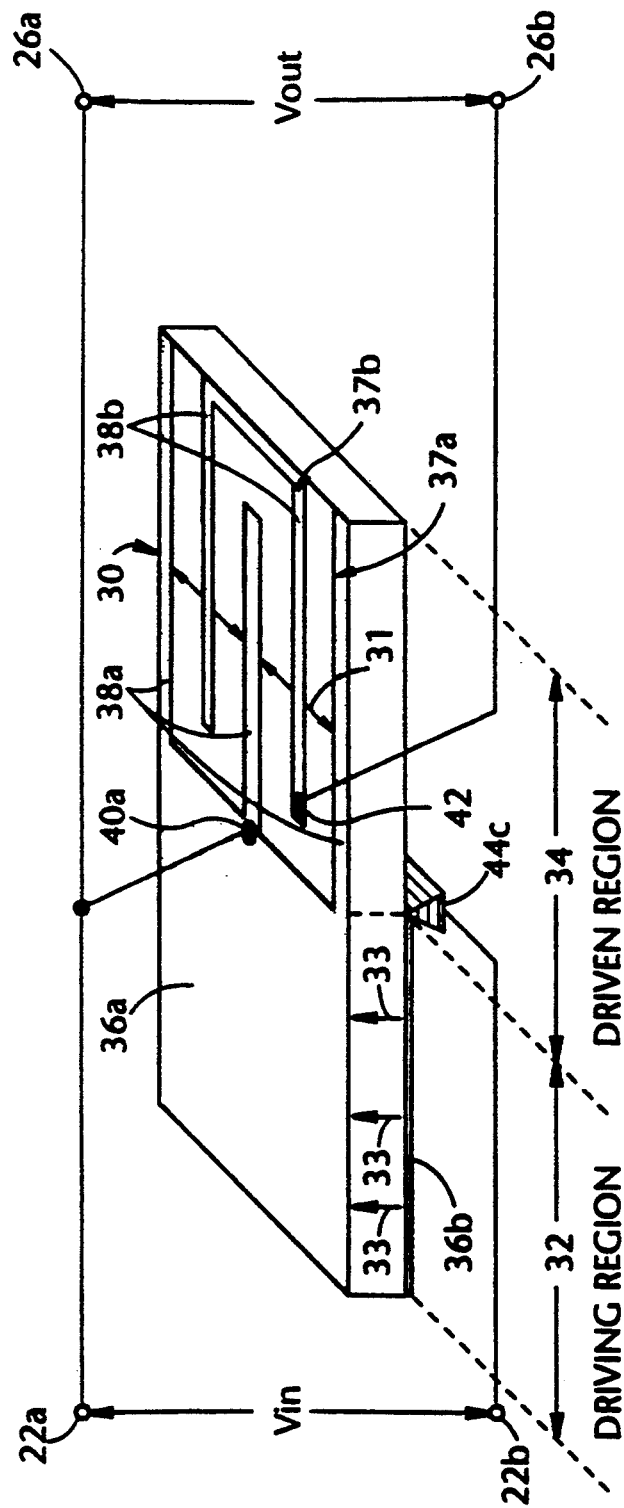
FIG. 4 is a schematic perspective view showing another variant of the first embodiment of the present invention.

FIG. 4 shows another variant of the first embodiment in perspective view.

The arrangement of FIG. 4 includes a support 44c of electrically conductive material. Therefore, a lead wire extending from the input terminal 22b is coupled to the support 44c. The remaining portions of the transformer of FIG. 4 are essentially the same as the counterparts of FIG. 2 and thus descriptions thereof are omitted.

Figure 5:
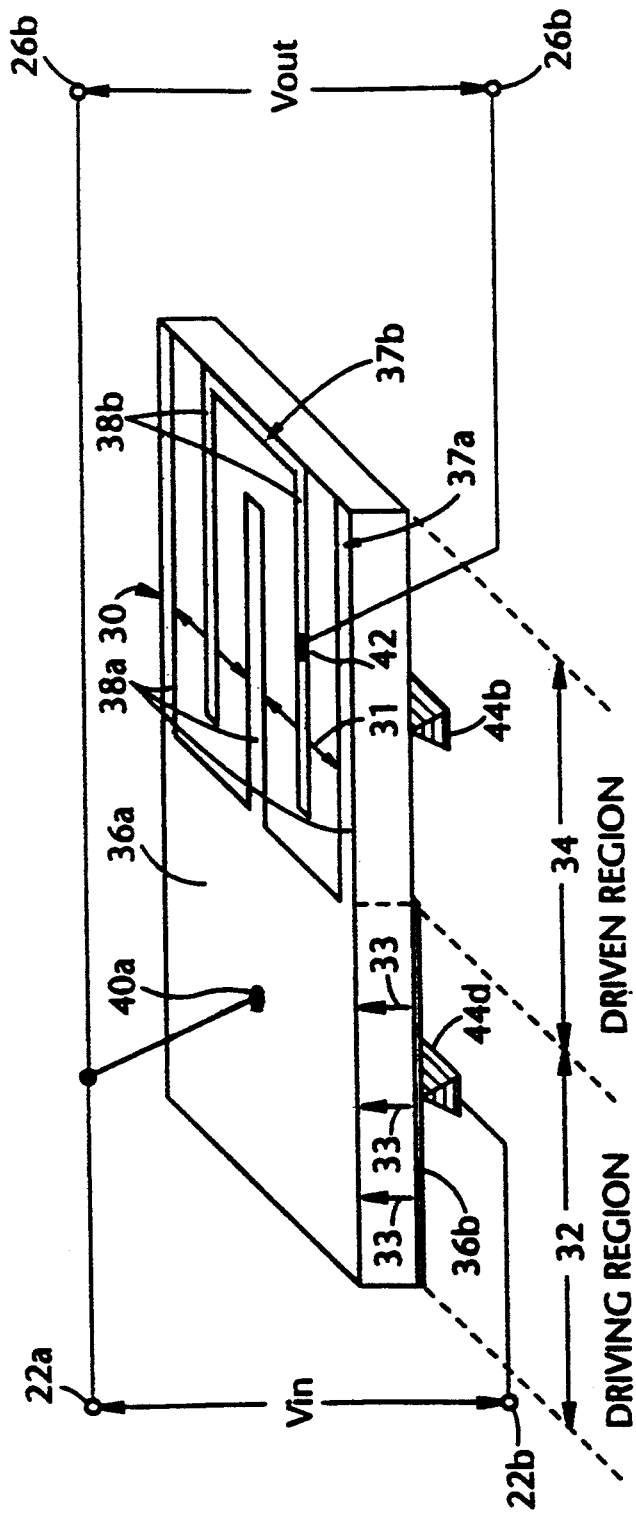
FIG. 5 is a schematic perspective view showing still another variant of the first embodiment of the present invention.

FIG. 5 shows an arrangement similar to that of FIG. 3. A support 44d of electrically conductive material is provided in place of the support 44a. Thus, a lead wire extending from the input terminal 22b is coupled to the support 44c. The remaining portions of the transformer of FIG. 5 are identical the counterparts of FIG. 3 so that the descriptions thereof are omitted for the purposes of simplifying the disclosure.

Figure 6:
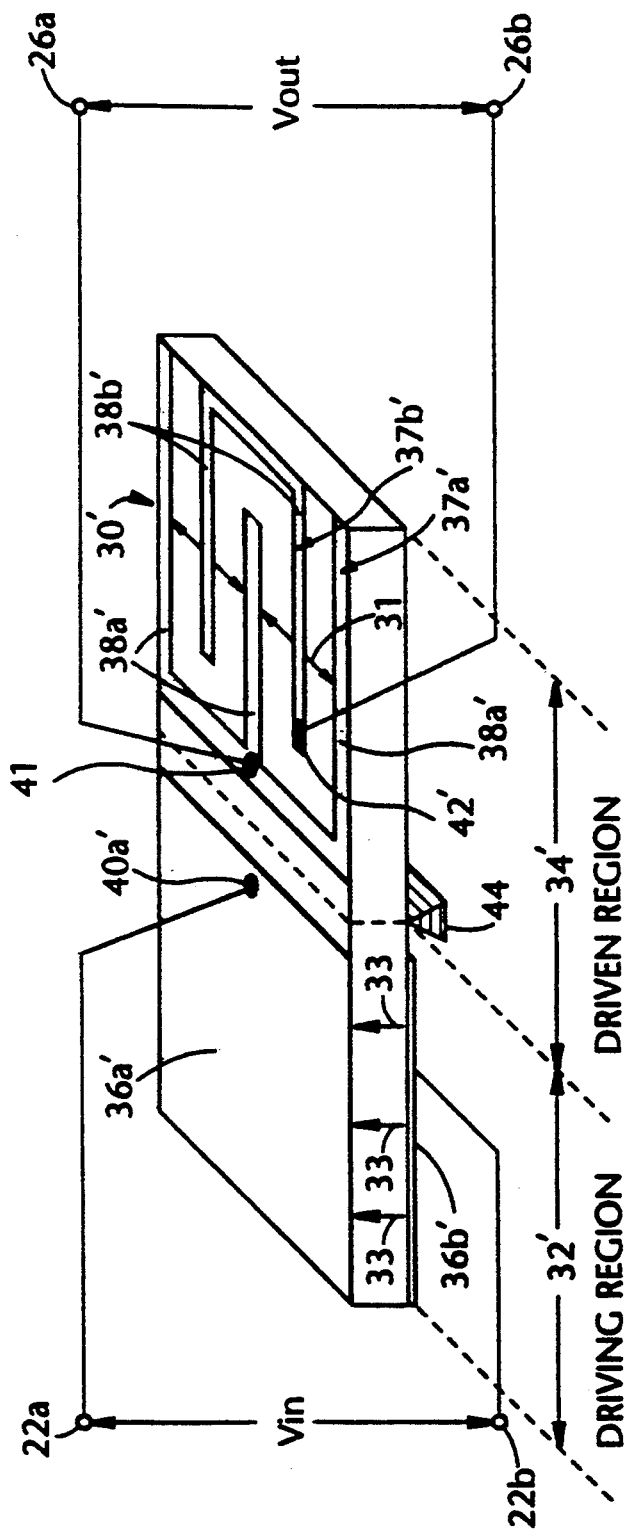
FIG. 6 is a schematic perspective view showing a second embodiment of the present invention.

FIG. 6 is a diagram showing a second embodiment of the present invention in perspective. Elements or portions of FIG. 6, which are substantially identical to those of FIG. 2, are denoted by like numerals.

The second embodiment includes a body 30' which is divided into a driving and driven regions 32' and 34' in the longitudinal direction of the body 30'. An important aspect of the second embodiment is that the two regions 32' and 34' are electrically isolated from each other. The region 32' is provided with two electrodes 36a' and 36b' and is arranged in a manner similar to the region 32 of the first embodiment. The driven region 34' has two electrodes 37a' and 37b' which are respectively provided with plural finger-like portions 38a' and 38b' and which are interdigitally arranged as shown. The input terminals 22a and 22b are coupled to the junctions provided on the electrodes 36a' and 36b' (only one a junction 40a' is shown) as in the first embodiment. On the other hand, the output terminals 26a and 26b are respectively coupled to junctions 41 and 42' formed on the electrodes 37a' and 37b'. The support 44 (non-conductive) is attached to the node of the mechanical vibration of the body 30'.

Since the input and output sides of the second embodiment is electrically isolated, various advantages are derived. For example, noises included in the input voltage do not adversely affect the operations of a device which is coupled to the output terminals 26a and 26b.

Reference is now made to FIG. 7, wherein there is shown a third embodiment of the present invention in perspective view. The piezoelectric transformer shown in FIG. 7 has a resonance mode of 3λ/2. A body 52 of piezoelectric material is divided into three regions 32, 34 and 52.

Although the electrodes of the region 34 are slightly different from those of FIG. 3, the third embodiment is arranged such that the driving region 52 is added to the arrangement shown in FIG. 3. Accordingly, the portions or members of the third embodiment, which correspond to those of the FIG. 3 arrangement, are represented by like numerals for the sake of convenience. The driving region 52 is polarized in the thickness direction of the body 50 and carries a pair of electrodes 54 and 56 applied respectively on the upper and lower major surfaces of the body 50. A support 58 is attached to the lower major surface at the node of the vibration of the body 50.

The arrangement of the third embodiment will be understood from the discussions made with reference to FIG. 2, and hence further descriptions are deemed redundant.

During the experiments performed with the transformer shown in FIG. 7 a working model was fabricated such that the body 50 had a longitudinal length of 102 mm, a width of 34 mm, and a thickness of 1.9 mm. When the body 50 was supplied with a sine wave voltage of 24 V, the body 50 resonated at a frequency of 91 KHz with an output load of 150 KΩ. The output electric power was 4 W.

As above mentioned, the number of the finger-like portions is not limited to that shown in FIG. 7.

Each of the supports of the second and third embodiment is made of dielectric material. As an alternative, each support of these embodiments can be made of electrically conductive material in the case of which the input and output lead wires can be applied to such supports.

As mentioned, above, the electrodes are formed on the piezoelectric body by patterning silver-palladium paste. As an alternative, however, each electrode of the aforesaid embodiments can be formed using ion implantation techniques in order to improve alignment of electric field between the electrodes.

Further, in the first embodiment shown in FIG. 2, additional electrodes which are symmetrical to the electrode 37a and 37b, can be applied to the lower major surface of the body 30.

It will be understood that the above disclosure is representative of only three possible embodiments and that various modifications can be made without departing from the concept of the instant invention.

What is claimed is:

1. A piezoelectric transformer comprising:
   a long relatively thin rectangular body of piezoelectric material, said body exhibiting a resonant mode of vibration at a predetermined frequency in a longitudinal direction of said body, said body being divided into first and second regions in said longitudinal direction;
   first and second electrodes applied respectively to first and second major surfaces of said first region, said first region being polarized in a thickness direction of said first region; and
   third and fourth electrodes which are formed on said first major surface of said second region and each of which has a plurality of finger-like portions extending in said longitudinal direction, each of said plurality of finger-like portions of said third electrode having one end electrically coupled to said first electrode, said fourth electrode having a bar portion which extends transversely of said body and from which said plurality of finger-like portions of said fourth electrode extend, said plurality of finger-like portion of said third and fourth electrode being arranged interdigitally, said second region having a plurality of regions which are defined by adjacent finger-like portions of said third and fourth electrodes, each of which is transversely polarized in a direction perpendicular to said longitudinal direction.

2. A piezoelectric transformer as claimed in claim 1, wherein each of said first and second regions extends in said longitudinal direction of said body a distance equal to one half of the length of said body.

3. A piezoelectric transformer as claimed in claim 1, wherein said body resonates as a half-wave resonator at said predetermined frequency.

4. A piezoelectric transformer as claimed in claim 1, wherein said body resonates as a full-wave resonator at said predetermined frequency.

5. A piezoelectric transformer as claimed in claim 1, wherein each of said third and fourth electrodes are formed by way of ion implantation.

6. A piezoelectric transformer as claimed in claim 1, wherein said second region further includes fifth and six electrodes which are applied to said second surface in a manner symmetrical to said third and fourth electrodes.

7. A piezoelectric transformer as claimed in claim 1, further including a support of dielectric material for supporting said body, said support being attached to said second surface at a node of said vibration of said body.

8. A piezoelectric transformer as claimed in claim 6, further including:
- a first electrical junction which is applied to a portion where said first and third electrodes are electrically coupled;
- a second electrical junction which is applied to said second electrode means in the vicinity of said node of said vibration; and
- a third electrical junction which is applied to said fourth electrode in the vicinity of said node of said vibration.

9. A piezoelectric transformer as claimed in claim 1, further including a support of electrically conductive material for supporting said body, said support attached to said second surface at a node of said vibration of said body and electrically coupled to said second electrode.

10. A piezoelectric transformer as claimed in claim 9, further including:
- a first electrical junction which is applied to a portion where said first and third electrodes are electrically coupled;
- a second electrical junction which is applied to said support; and
- a third electrical junction which is applied to said fourth electrode in the vicinity of said nodal portion.

11. A piezoelectric transformer comprising:
- a long relatively thin rectangular body of piezoelectric material, said body having first and second major surfaces and exhibiting a resonant mode of vibration at a predetermined frequency in a longitudinal direction of said body, said body being divided into first and second regions in said longitudinal direction;
- first and second electrodes being applied respectively to said first and second major surfaces of said first region, said first region being polarized in a thickness direction of said first region;
- third and fourth electrodes which are formed on said first major surface of said second region and each of which has a plurality of finger-like portions extending in said longitudinal direction, said third electrode having an elongated portion which extends transversely of said body and from which said plurality of finger-like portions of said third electrode extend, said fourth electrode having an elongated portion which extends transversely of said body and from which said plurality of finger-like portions of said fourth electrode extend, said third and fourth electrode being arranged interdigitally, said second region having a plurality of regions which are defined by adjacent finger-like portions of said third and fourth electrodes, each of which is transversely in a direction perpendicular to said longitudinal direction.

12. A piezoelectric transformer as claimed in claim 11, wherein each of said first and second regions extends in said longitudinal direction of said body a distance equal to one half of the length of said body.

13. A piezoelectric transformer as claimed in claim 11, wherein said body resonates as a half-wave resonator at said predetermined frequency.

14. A piezoelectric transformer as claimed in claim 11, wherein said body resonates as a full-wave resonator at said predetermined frequency.

15. A piezoelectric transformer as claimed in claim 11, wherein each of said third and fourth electrodes are formed by way of ion implantation.

16. A piezoelectric transformer as claimed in claim 11, wherein said second region further includes fifth and six electrodes which are applied to said second surface in a manner symmetrical to said third and fourth electrodes.

17. A piezoelectric transformer as claimed in claim 11, further including a support of dielectric material for supporting said body, said support being attached to said second surface at a node of said vibration of said body.

18. A piezoelectric transformer as claimed in claim 17, further including:
- first and second electrical junctions which are respectively applied to said first and second electrodes in the vicinity of said node of said vibration;
- a third electrical junction which is applied to said third electrode means in the vicinity of said node of said vibration; and
- a fourth electrical junction which is applied to said fourth electrode in the vicinity of said node of said vibration.

19. A piezoelectric transformer comprising a long relatively thin rectangular body of piezoelectric material, said body having first and second major surfaces and exhibiting a resonant mode of vibration at a predetermined frequency in a longitudinal direction of said body, said body being divided into first, second and third regions in said longitudinal direction,
- first and second electrodes being applied respectively to said first and second major surfaces of said first region, said first region being polarized in a thickness direction of said first region;
- third and fourth electrodes being applied respectively to said first and second major surfaces of said third region, said second region being polarized in a thickness direction of said third region;
- fifth and sixth electrodes which are formed on said first major surface of said second region and each of which has a plurality of finger-like portions extending in said longitudinal direction, said fifth electrode being electrically coupled to said first and third electrodes, said sixth electrode having an elongated portion which extends transversely of said body and from which said plurality of finger-like portions of said sixth electrode extend, said plurality of finger-like portions of said third and fourth electrode being arranged interdigitally, said second region having a plurality of regions which are defined by adjacent finger-like portions of said fifth and sixth electrodes, each of which is transversely polarized in a direction perpendicular to said longitudinal direction.

20. A piezoelectric transformer as claimed in claim 19, wherein each of said first, second and third regions extends in said longitudinal direction of said body a distance equal to one-third of the length of said body.

21. A piezoelectric transformer as claimed in claim 19, wherein said body resonates as 3/2-wave resonator at said predetermined frequency.

22. A piezoelectric transformer as claimed in claim 20, further including a body support member which is fixed to said second surface of said body at each of nodes of said vibration of said body.

* * * * *